United States Patent
Salomon

(10) Patent No.: US 7,592,881 B2
(45) Date of Patent: Sep. 22, 2009

(54) POWER BROADBAND AMPLIFIER

(75) Inventor: Andreas Salomon, Unterschleissheim (DE)

(73) Assignee: EADS Deutschland GmbH, Ottobrunn (DE)

(*) Notice: Subject to any disclaimer, the term of this patent is extended or adjusted under 35 U.S.C. 154(b) by 131 days.

(21) Appl. No.: 11/936,388

(22) Filed: Nov. 7, 2007

(65) Prior Publication Data

US 2008/0136530 A1    Jun. 12, 2008

(30) Foreign Application Priority Data

Nov. 8, 2006    (DE) .................... 10 2006 052 611

(51) Int. Cl.
*H01P 5/12*    (2006.01)
*H03F 3/60*    (2006.01)

(52) U.S. Cl. ...................... 333/117; 333/118

(58) Field of Classification Search ............... 333/117, 333/118, 120, 121; 330/124 R
See application file for complete search history.

(56) References Cited

U.S. PATENT DOCUMENTS

| | | | | |
|---|---|---|---|---|
| 3,911,372 | A | * | 10/1975 | Seidel .................... 330/286 |
| 4,490,684 | A | * | 12/1984 | Epsom et al. ............ 330/149 |
| 4,656,434 | A | | 4/1987 | Selin |
| 6,496,061 | B1 | | 12/2002 | Bloom et al. |
| 2004/0189380 | A1 | | 9/2004 | Myer et al. |
| 2006/0145761 | A1 | | 7/2006 | Pribble et al. |

FOREIGN PATENT DOCUMENTS

| | | |
|---|---|---|
| DE | 28 07 813 B1 | 6/1979 |
| DE | 37 09 169 A1 | 9/1988 |
| EP | 1 521 361 A1 | 4/2005 |
| JP | 2-111111 A | 4/1990 |
| WO | WO 00/64048 A1 | 10/2000 |
| WO | WO 2005/088830 A1 | 9/2005 |

OTHER PUBLICATIONS

European Search Report dated May 21, 2008 with an English translation of the pertinent portions (Eight (8) pages).
German Office Action dated May 23, 2007 with English translation of relevant portion (Five (5) Pages).

* cited by examiner

*Primary Examiner*—Dean O Takaoka
(74) *Attorney, Agent, or Firm*—Crowell & Moring LLP

(57) ABSTRACT

A circuit for broadband amplification is provided. The circuit includes an input HF_IN and an output HF_OUT, a first 90° hybrid coupler being connected to the input HF_IN of the circuit and a second 90° hybrid coupler being connected to the output HF_OUT of the circuit, and two amplifier stages being connected in parallel between the first and the second 90° hybrid coupler, the 90° hybrid couplers being hybrid couplers having an operating range of 1/n octaves between a lower frequency value and an upper frequency value, $n \in \mathbb{N}\setminus\{0\}$, i.e., n is an element of the natural positive whole numbers in such a way that the upper frequency value is greater than the lower frequency range and simultaneously less than two times the value of the lower frequency range, and the amplifier stages being based on transistors having a III-nitride, or SiC, or diamond basis.

8 Claims, 7 Drawing Sheets

POWER BROADBAND AMPLIFIER

CROSS REFERENCE TO RELATED APPLICATIONS

This application claims priority under 35 U.S.C. § 119 to German Patent Application No. 10 2006 052 611.2-35 filed Nov. 8, 2006, the entire disclosures of which are herein expressly incorporated by reference.

BACKGROUND AND SUMMARY OF THE INVENTION

The present invention relates to a circuit for broadband amplification. German Patent Document DE 37 09 169 A1 discloses an antenna coupler in which a first 90° hybrid coupler is connected to the input of the antenna coupler and a second 90° hybrid coupler is connected to the output of the antenna coupler. Two stop filters are connected in parallel between the first and the second hybrid coupler, each stop filter being connected in series to a phase shifter element. In this antenna coupler, the bandwidth of the signal to be transmitted is a function of the bandwidth of the particular 90° hybrid coupler. Broadband amplification is not possible using the known antenna coupler.

Linear broadband amplifiers (class A) are predominantly used in measuring technology as measuring amplifiers. In this case, multiple transistor stages adapted to broadband are connected one behind another to form an overall amplifier. The particular transistors receive a suitable standby current to ensure the operating point for linear amplifier operation. The predominantly used semiconductor technology for these amplifiers is GaAs. These measuring amplifiers typically operate very linearly, but have a restricted frequency range and are limited in saturation power.

To improve the broadband adaptation of the individual amplifier stages, HF negative feedback (RC element) is used between the HF input and output. This HF negative feedback dampens a growing oscillation tendency of the HF transistors, caused by their increased amplification characteristic (FIG. 1). The HF negative feedback also ensures uniform amplification behavior over a very wide frequency range. A loss of amplification is accepted.

Broadband 90° hybrid couplers are used to improve the input adaptation (FIG. 2). In addition, HF negative feedback is typically used for each amplifier stage. The input adaptation is thus improved over the frequency range of the 90° hybrid couplers. In addition, the saturation power of the amplifier is increased.

A circuit configuration for achieving power adaptation in noise-adapted high-frequency amplifiers is disclosed in German Patent Document DE 28 07 813 B1.

The mode of operation of a 3 dB 90° hybrid coupler is known. A 90° hybrid coupler acts, as indicated by the name, like a directional coupler which distributes half of the supplied HF power to each of two HF outputs. The HF signals at these two HF outputs have a phase difference of 90°. If HF power is reflected back into the 3 dB outputs, addition of the HF power only occurs at the insulated output. At this point, the reflected HF power may be converted into heat using a terminating resistor. Therefore, no reflected HF power may come back to the input of the 90° hybrid coupler, which results in a significant improvement of the input standing wave ratio VSWR of the overall circuit.

Broadband 90° hybrid couplers are very large in their dimensions. Anaren, Inc. provides a 90° hybrid coupler which is compatible with HF power up to 100 W cw over a frequency range of 500 MHz to 3.0 GHz. However, dimensions of approximately 15×3.5×1 cm are too large for development of small and compact transmitters. Although almost no reduction in size of such a coupler may be made from the physical aspect, the desire still exists of reducing the size. Furthermore, broadband hybrid couplers are limited to lower power levels in their maximum permissible power.

Kuhne Electronic provides broadband amplifiers. However, these amplifiers have an amplification having a bandwidth of less than one octave.

In the following, the term bandwidth is understood as the size of the frequency range which a signal occupies between its lower and upper limiting frequencies. Furthermore, the term octave is understood as an interval having a frequency ratio of 2:1 between an upper frequency value and a lower frequency value.

Exemplary embodiments of the present invention provide a compact circuit for broadband amplification, using which a broadband amplification of more than 1 octave is possible.

The circuit of the present invention includes an input HF_IN and an output HF_OUT. A first 90° hybrid coupler connected to the input HF_IN and a second 90° hybrid coupler connected to the output HF_OUT. Two amplifier stages are connected in parallel between the first and the second 90° hybrid couplers. The 90° hybrid couplers have an operating range of 1/n octaves between a lower frequency value and an upper frequency value, $n \in \mathbb{N} \setminus \{0\}$, where n is an element of the natural positive whole numbers in such a way that the upper frequency value is greater than the lower frequency range and simultaneously less than two times the value of the lower frequency range, and the amplifier stages are transistors having a III-nitride, or SiC, or diamond basis.

In the circuit according to the present invention, 90° hybrid couplers are used, which have an operating range of 1/n octaves between a lower frequency value and an upper frequency value, $n \in \mathbb{N} \setminus \{0\}$, i.e., n is an element of the natural positive whole numbers. In other words, the upper frequency value of the operating range is greater than the lower frequency value and simultaneously less than or equal to two times the value of the lower frequency range.

A 90° hybrid coupler having such an operating range is also referred to in the following as a narrowband hybrid coupler. In contrast to a broadband hybrid coupler, which has an operating range having an upper frequency value which is greater than two times the value of the lower frequency range of the operating range.

The present invention allows 90° hybrid couplers to be used both in SMD or drop-in construction and also as aluminum-housed 90° hybrid couplers. Drop-in components are understood by those skilled in the art as a directly fitting replacement part, i.e., replacement of an existing component, circuit, module, etc. within an existing circuit, by inserting a more modern or higher performance embodiment, without the infrastructure of the circuit board, the software, or anything else having to be modified for this purpose. An SMD component (surface mounted device) is understood by those skilled in the art as a surface-mountable component.

A possible SMD 90° hybrid coupler is, for example, the component Anaren Xinger 11306-3 and is offered by Anaren, Inc. These narrowband SMD 90° hybrid couplers are available for the mobile wireless market as a mass-produced product. Depending on how large the bandwidth of the coupler is selected, the power compatibility of the component also increases.

According to exemplary embodiments of the present invention, the amplifier stages are based on transistors which are manufactured from semiconductor materials having large electronic bandgaps. Such transistors are also referred to as wide bandgap transistors. Such transistors may be manufactured, for example, on the basis of III-nitride semiconductors, e.g., GaN, Aln, or on the basis of silicon carbide (SiC) or diamond.

Wide bandgap transistors are distinguished by a higher input impedance in contrast to typical transistors, e.g., based on GaAs (III-V semiconductors). In contrast to transistors based on GaAs, wide bandgap transistors do not tend to have vibration response in the range from 100 MHz-500 MHz. Wide bandgap transistors may thus also be used in this frequency range, while in contrast transistors based on GaAs tend to oscillate in this frequency range.

Other objects, advantages and novel features of the present invention will become apparent from the following detailed description of the invention when considered in conjunction with the accompanying drawings.

BRIEF DESCRIPTION OF THE DRAWINGS

The present invention is described in greater detail in the following on the basis of figures.

DETAILED DESCRIPTION OF THE DRAWINGS

Figure 1:
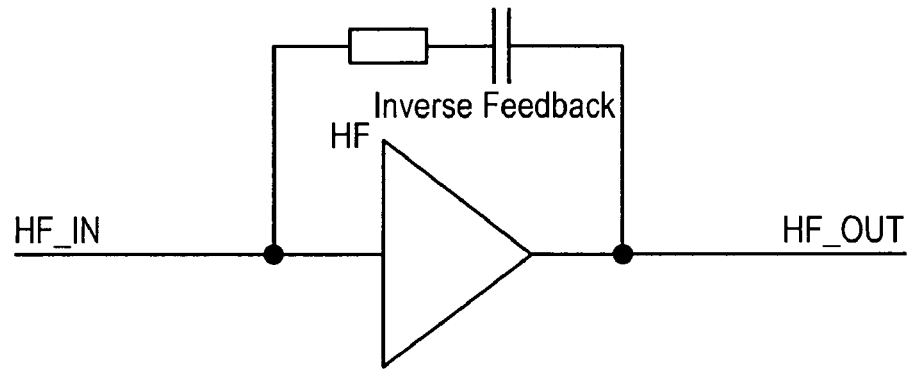
FIG. 1: shows the basic structure of HF negative feedback.

FIG. 1 shows a transistor amplifier stage (already described above) of a linear broadband amplifier having HF negative feedback. For this purpose, multiple broadband adapted transistor stages 2 are connected one behind another to form an overall amplifier. The particular transistors receive a suitable standby current to ensure the operating point for linear amplifier operation. The predominantly used semiconductor technology for these amplifiers is GaAs.

Figure 2:
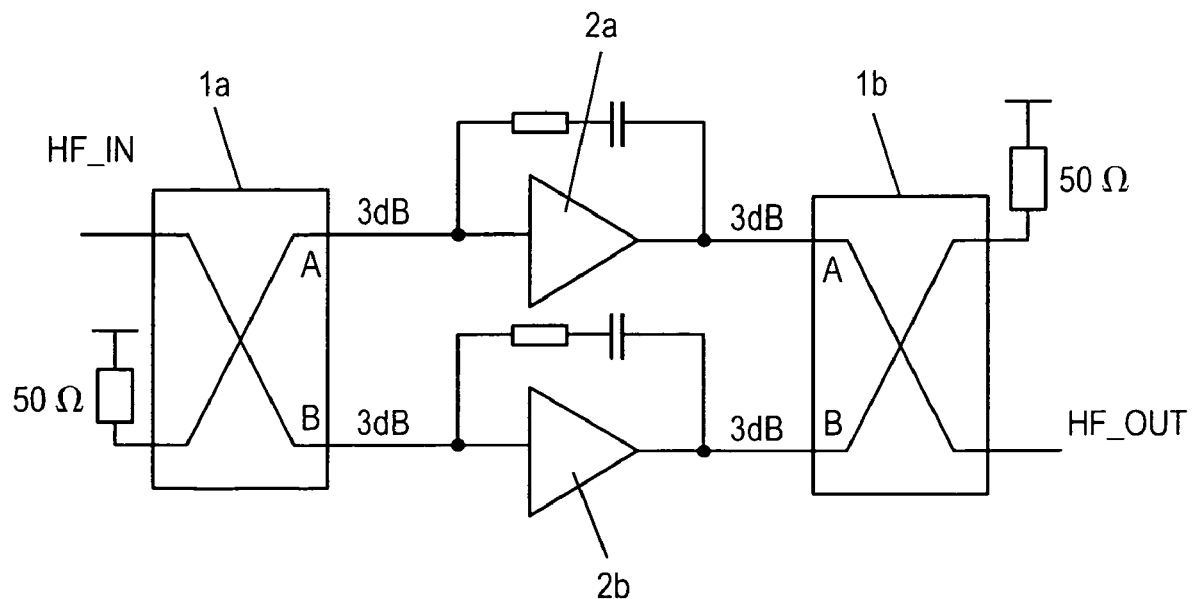
FIG. 2: shows the structure of an amplifier circuit having 90° hybrid couplers and having amplifier stages, connected in parallel, having HF negative feedback.

FIG. 2 shows the structure of an amplifier circuit having 90° hybrid couplers. By using broadband 90° hybrid couplers 1a, 1b, the input adaptation of the hybrid couplers 1a, 1b above their particular operating frequency range is improved. Two amplifier stages 2a, 2b are connected in parallel between the two hybrid couplers 1a, 1b. Each amplifier stage 2a, 2b has HF negative feedback. The signal to be amplified is fed to the circuit at the input HF_IN. The amplified signal, which is led to an antenna, for example, is applied to the output HF_OUT.

Figure 3:
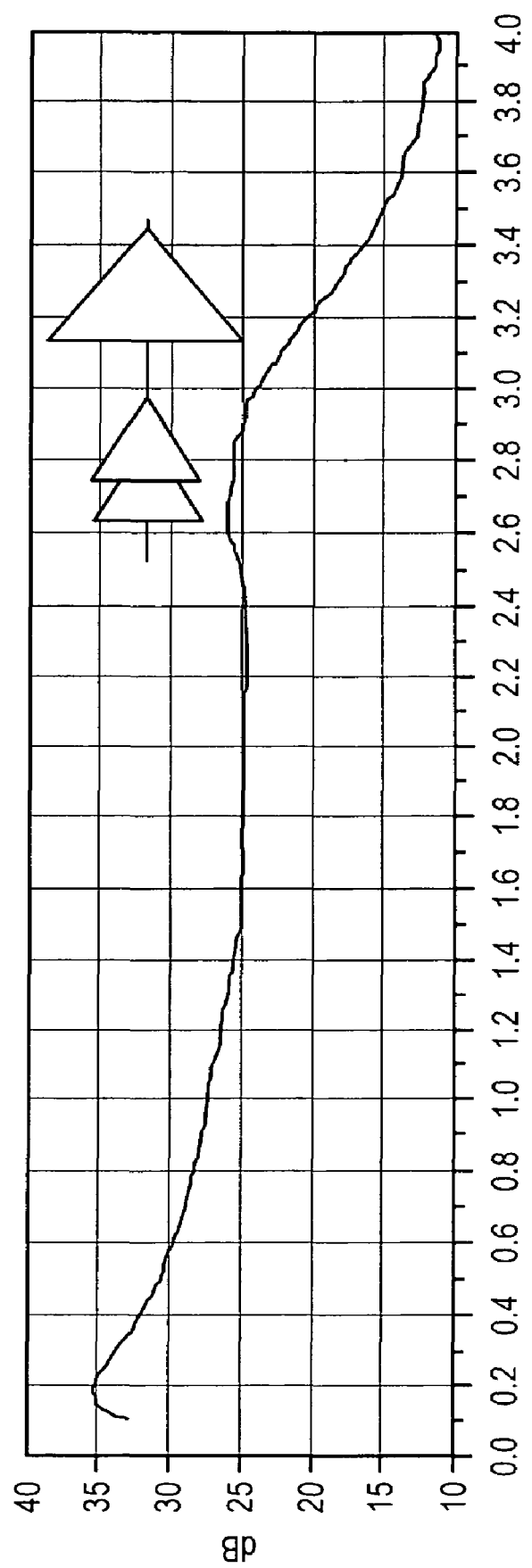
FIG. 3: shows the curve of the frequency-dependent amplification of a transistor amplifier stage having wide bandgap transistors without HF negative feedback.

FIG. 3 shows the exemplary curve of the frequency-dependent amplification of a transistor amplifier stage having wide bandgap transistors without HF negative feedback. In this illustration, the frequency-dependent curve of the amplification of a transistor amplifier stage having a GaN transistor, type RT240PD from RFHIC, is shown as an example. The amplification is in the range from 1.5 GHz to 3.0 GHz at approximately 25 dB. Below 1.5 GHz, the transistor amplifier stage is suitably adapted, so that the amplification in this range is above 25 dB.

Figure 3A:
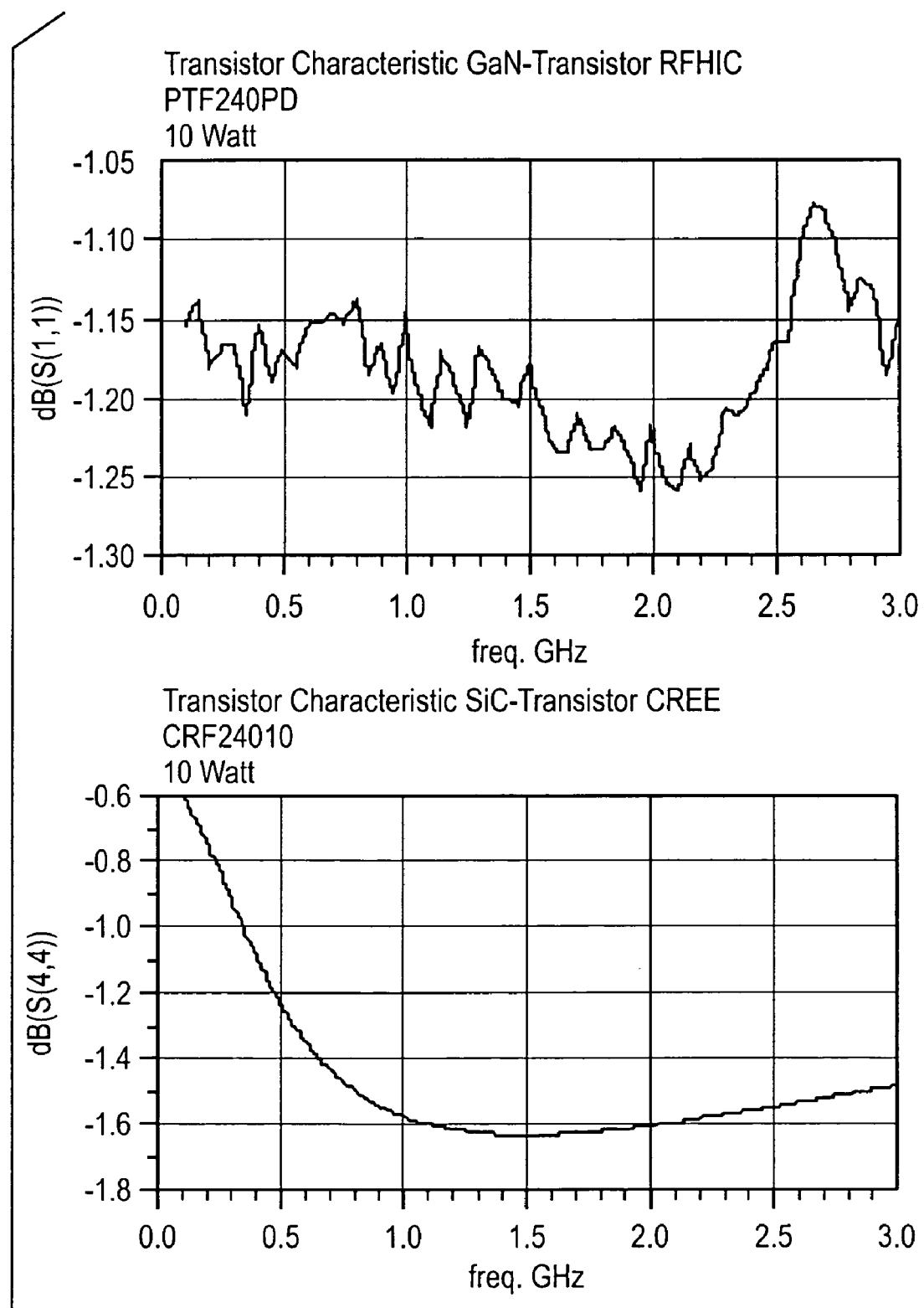
FIG. 3a: shows input return loss S11 of the exemplary transistors PTF240PD (GaN) and CRF24010 (SiC)

Typically, wide bandgap transistors only display very low return loss values (S11) above the desired frequency range (FIG. 3a). The GaN transistor of type PTF240PD has values of 1.1 dB<S11<1.25 dB (left illustration in FIG. 3a). The SiC transistor of type CRF24060 displays an input return loss of 0.65 dB<S11<0.90 dB over the frequency range of 100 MHz-3.0 GHz (right illustration in FIG. 3a). This circumstance of very low S11 values makes the integration of these transistors in an amplifier chain more difficult, because the output power of prior amplifier components in an amplifier chain is again primarily reflected back at the input of the wide bandgap transistor. This may result in the destruction of the prior amplifier components.

Figure 3B:
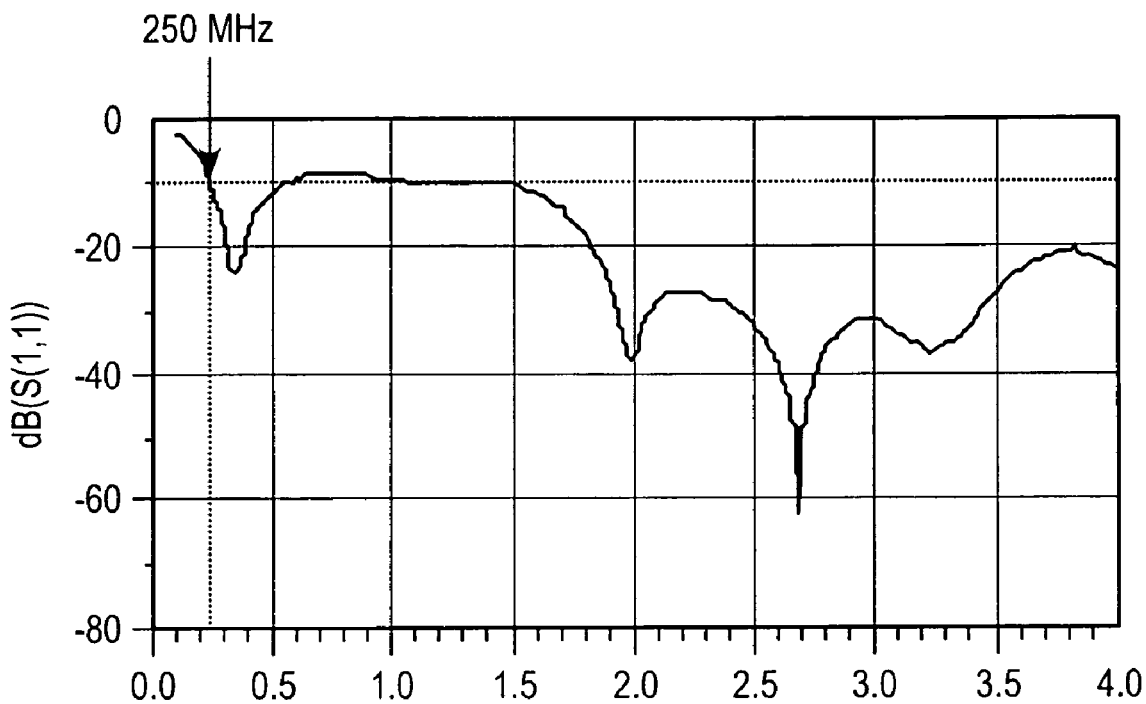
FIG. 3b: shows input return loss of the amplifier circuit from FIG. 6 according to the present invention.

The use of a 90° hybrid coupler improves the input return loss to values of S11>10 dB over a frequency range of 250 MHz-3.0 GHz (FIG. 3b). Therefore, an amplifier construction having 90° hybrid couplers is better suitable as an integratable system component.

Figure 4:
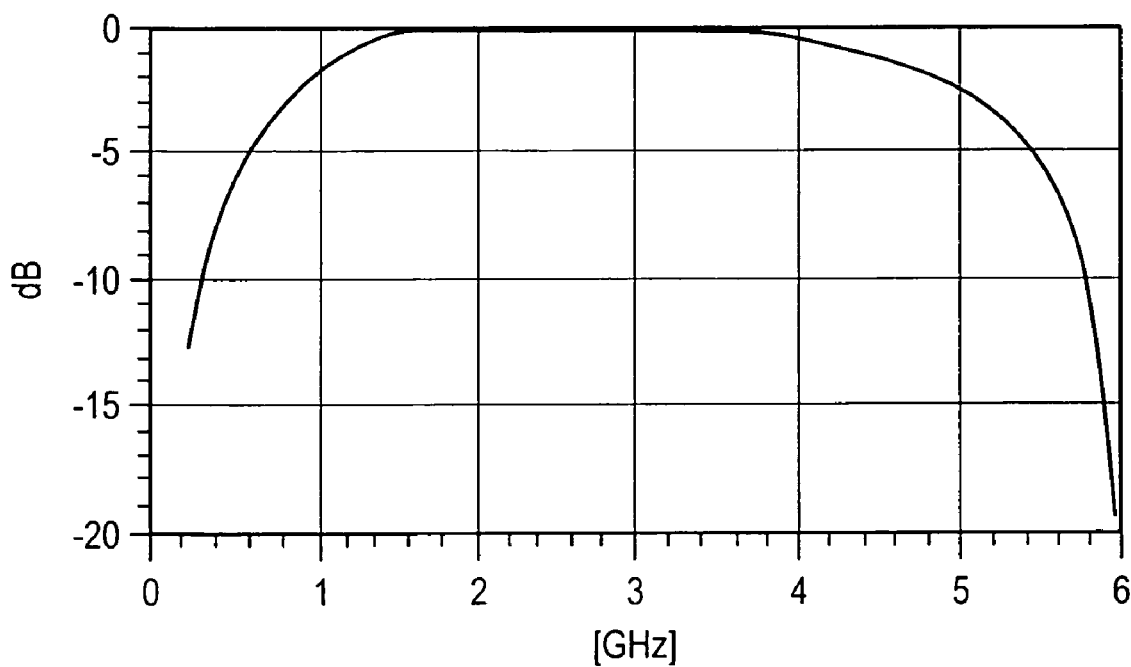
FIG. 4: shows the curve of the damping of the series circuit of two narrowband 90° hybrid couplers (type XINGER 11306-3; 2.0 GHz-4.0 GHz)

FIG. 4 shows the frequency-dependent curve of the amplification of two narrowband 90° couplers, connected in series, which are Xinger couplers model 11306-3 from Anaren, Inc.

The narrowband 90° hybrid couplers operate in the frequency range from 2.0-4.0 GHz at constant coupling factor of 3 dB. The phase stability of 90° is also ensured. The amplification losses in this frequency range are low, and the damping of the hybrid coupler increases strongly below 2.0 GHz and above 4.0 GHz.

In addition, FIG. 3 shows that the transistor amplifier stage is suitably adapted. The input and output adaptation network of the particular transistors is implemented by microstrip lines, which represent a combination of inductors and capacitors in a suitable way to obtain the desired amplification curve over the entire frequency range. The design of an adaptation network is known to those skilled in the art.

In the range from 100 MHz to 2.0 GHz, i.e., over a frequency range of approximately 5 octaves, the transistor amplifier stage has an amplification which compensates for the damping of the narrowband 90° hybrid couplers. The transistor amplifier stage is expediently adapted in such a way that in one or more predefinable frequency ranges, in which the 90° hybrid couplers have damping values of greater than 3 dB, the amplification of the amplifier stages compensate for these damping values, so that the amplification lies within a predefinable value range at the output of the circuit in a frequency range of k octaves, $k \in N \backslash \{0\}$.

Figure 5:
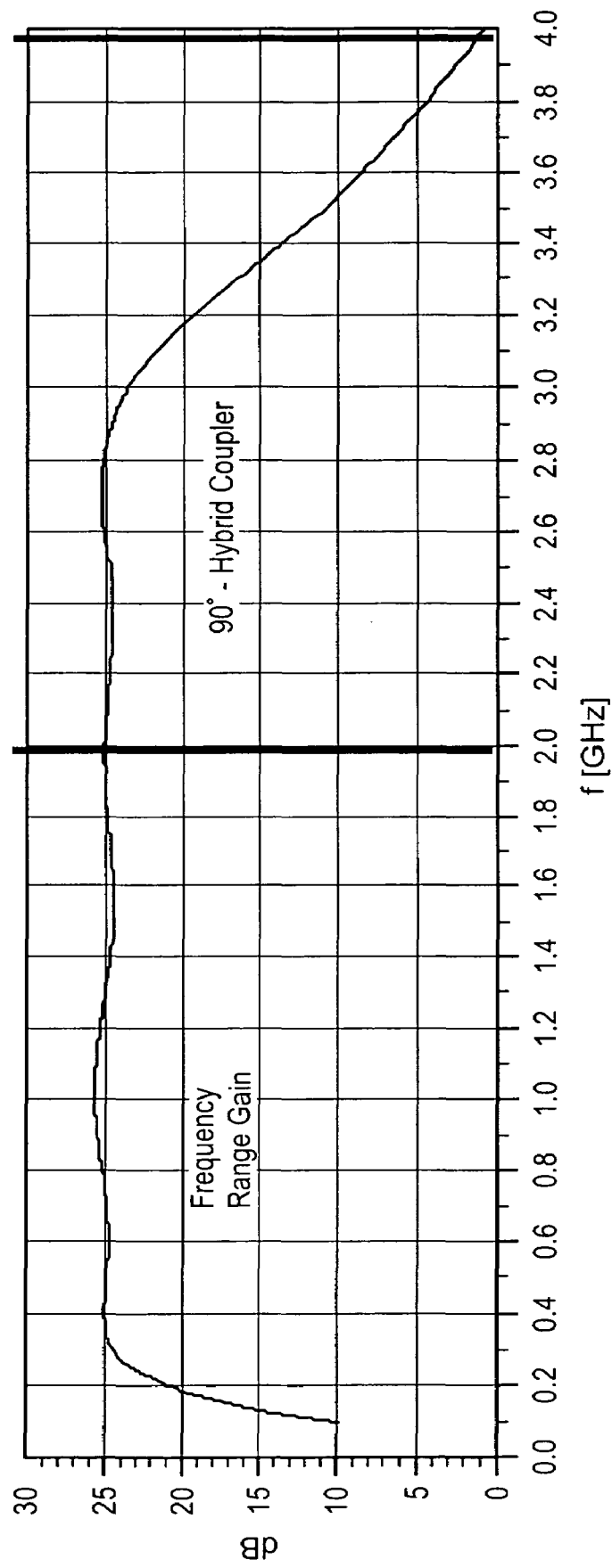
FIG. 5: shows the curve of an additive superposition of FIG. 3 and FIG. 4, FIG. 6: shows the structure of a circuit according to the present invention.
Figure 6:
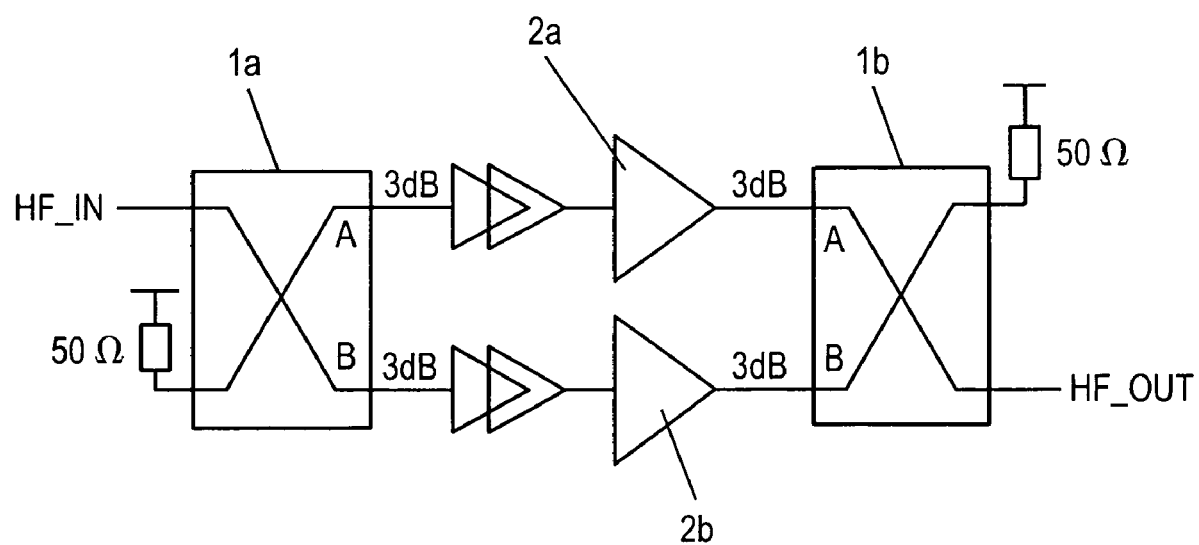

FIG. 5 shows the frequency-dependent curve of the amplification of a circuit according to the present invention in FIG. 6. The frequency-dependent amplification curve in FIG. 5 is the additive linkage of the amplification curves shown in FIGS. 3 and 4. FIG. 5 shows that the amplification curve is 24 dB or above in the frequency range from 300 MHz to 3000 MHz. The circuit according to the present invention displays a constant amplification behavior over a frequency range of approximately 3 octaves, i.e., 300 MHz-600 MHz, 600 MHz-1200 MHz, and 1200 MHz-3200 MHz. In contrast to the amplification curve of the 90° hybrid couplers shown in FIG.

5, the circuit according to the present invention has a broadband increase of 1700 MHz at 24 dB amplification.

Using the circuit according to the present invention, an amplification of 24 dB is thus possible over a frequency range of 300 MHz to 3000 MHz, without having to change over between individual amplifier stages.

Of course, the circuit according to the present invention is not restricted to an operating range from 300 MHz to 3000 MHz. By selecting suitable transistor amplifier stages in wide bandgap technology, broadband amplifier circuits having an operating range from 100 MHz to 5000 MHz are possible.

Figure 7:
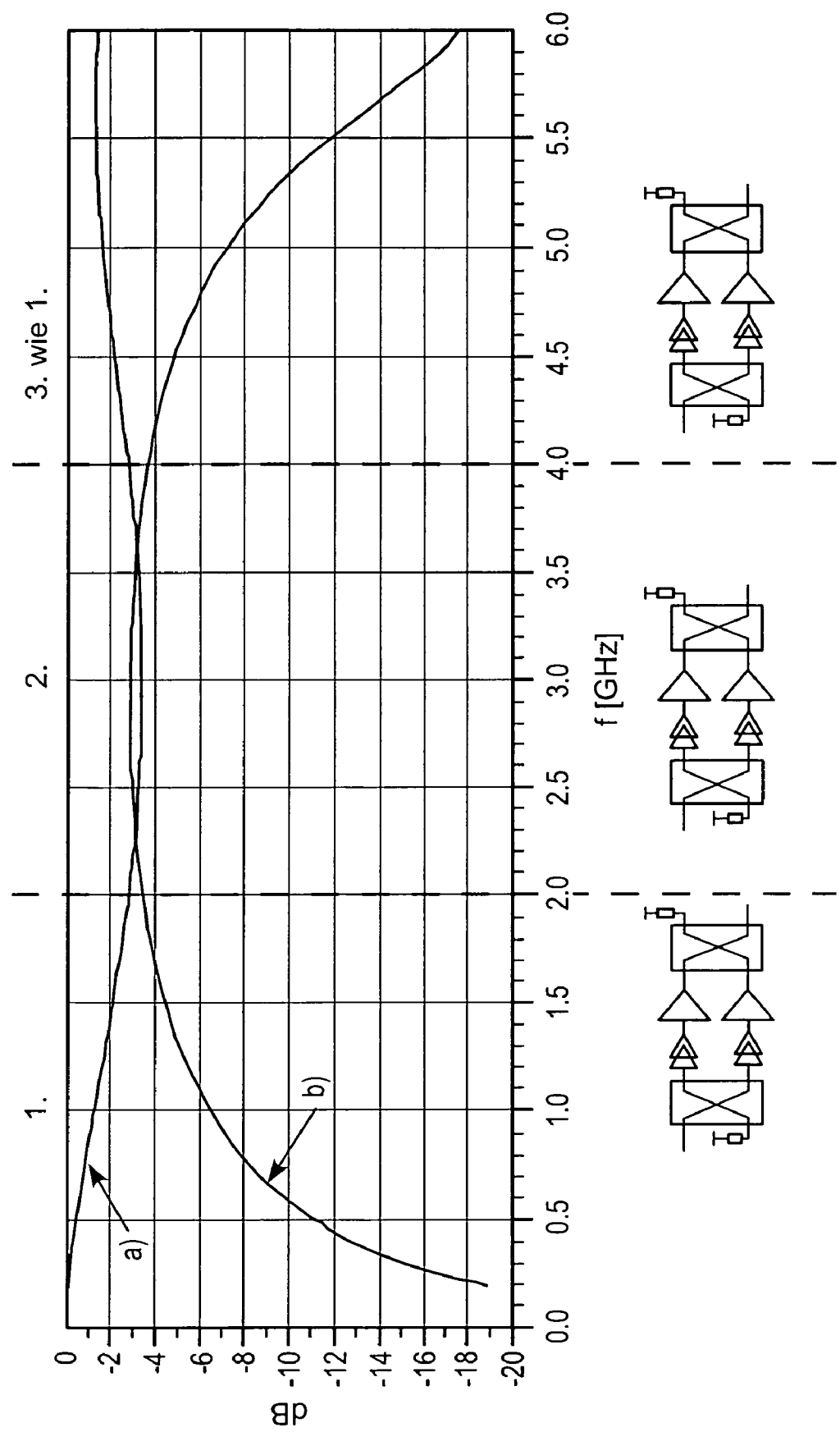
FIG. 7: shows the curve of the coupling of the HF input power on the parallel amplifier trains of a circuit according to the present invention, caused by the 90° hybrid coupler 1a in FIG. 6.

The principle of broadband expansion will be explained again on the basis of FIG. 7. FIG. 7 shows the coupling curve of the 90° hybrid coupler 1a from FIG. 6, which is in its specified range of 2.0 GHz-4.0 GHz at 3.0 dB (type Anaren Xinger 11306-3).

The curve a) has a coupling curve from 0 dB to −3 dB. The operating range of the first hybrid coupler 1a for the port A (FIG. 6) is thus between 2.0 and 4.0 GHz. The curve b) shows the coupling curve from −20 dB to at most −3 dB. The operating range of the second hybrid coupler 1b for the port B is thus also between 2.0 and 4.0 GHz.

The illustration thus shows the dimension of the decoupled power at the ports A and B. The consequence of using the 90° hybrid coupler 1a is that in the range 1 (100 MHz to 2.0 GHz), more input power is coupled in the transistor amplifier stage 2a, also referred to as the HF train, having the transistor 2a, than in the HF train having transistor 2b. This is also true for the range 3 (>4.0 GHz).

In the range 2 (2.0 GHz to 4.0 GHz) both HF trains receive an equal amount of HF input power, because the coupling is 3.0 dB in each case.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A circuit for broadband amplification comprising:
an input HF_IN;
an output HF_OUT;
a first 90° hybrid coupler connected to the input HF_IN;
a second 90° hybrid coupler connected to the output HF_OUT;
two amplifier stages connected in parallel between the first and the second 90° hybrid couplers,
wherein the 90° hybrid couplers have an operating range of 1/n octaves between a lower frequency value and an upper frequency value, n∈N\{0}, where n is an element of the natural positive whole numbers in such a way that the upper frequency value is greater than the lower frequency range and simultaneously less than two times the value of the lower frequency range, and the amplifier stages are transistors having a III-nitride, or SiC, or diamond basis.

2. The circuit according to claim 1, wherein the amplifier stages are connected to the 90° hybrid couplers in such a way that in one or more predefinable frequency ranges, in which the 90° hybrid couplers have damping values greater than 3 dB, the amplification of the amplifier stages compensates for these damping values so that at the output HF_OUT of the circuit the amplification is in a frequency range of k octaves within a predefinable value range k∈N\{0}.

3. The circuit according to claim 1, wherein the 90° hybrid couplers are surface-mountable components.

4. The circuit according to claim 1, wherein the 90° hybrid couplers are drop-in components.

5. The circuit according to claim 1, wherein the 90° hybrid couplers are aluminum-housed components.

6. The circuit according to claim 2, wherein the 90° hybrid couplers are surface-mountable components.

7. The circuit according to claim 2, wherein the 90° hybrid couplers are drop-in components.

8. The circuit according to claim 2, wherein the 90° hybrid couplers are aluminum-housed components.

* * * * *